(12) United States Patent
Kim et al.

(10) Patent No.: US 8,546,261 B2
(45) Date of Patent: Oct. 1, 2013

(54) SLURRY FOR POLISHING AND PLANARIZATION METHOD OF INSULATING LAYER USING THE SAME

(75) Inventors: Sangkyun Kim, Yongin-si (KR); NamSoo Kim, Suwon-si (KR); JongWoo Kim, Hwaseong-si (KR); Yun-Jeong Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 246 days.

(21) Appl. No.: 13/034,345

(22) Filed: Feb. 24, 2011

(65) Prior Publication Data

US 2011/0207326 A1    Aug. 25, 2011

(30) Foreign Application Priority Data

Feb. 25, 2010  (KR) .................. 10-2010-0017283

(51) Int. Cl.
*H01L 21/302*    (2006.01)

(52) U.S. Cl.
USPC ........... 438/692; 438/689; 438/690; 438/691; 438/693; 216/53; 216/88; 216/89; 216/90; 216/91; 257/E21.23; 252/79.1; 252/79.4

(58) Field of Classification Search
None
See application file for complete search history.

(56) References Cited

U.S. PATENT DOCUMENTS

| | | | |
|---|---|---|---|
| 6,106,854 A * | 8/2000 | Belfer et al. | 424/405 |
| 7,071,105 B2 | 7/2006 | Carter et al. | |
| 2004/0065022 A1 * | 4/2004 | Machii et al. | 51/309 |
| 2004/0152309 A1 | 8/2004 | Carter et al. | |
| 2006/0144824 A1 | 7/2006 | Carter et al. | |
| 2006/0216953 A1 | 9/2006 | Nakajima et al. | |

FOREIGN PATENT DOCUMENTS

| | | |
|---|---|---|
| JP | 3672493 | 4/2005 |
| JP | 2006-203235 | 8/2006 |
| JP | 2006-520530 | 9/2006 |
| KR | 10-0567230 A | 1/2005 |
| KR | 10-0555432 A | 3/2005 |
| WO | 9943761 | 2/1999 |
| WO | 2004069947 A1 | 8/2004 |

OTHER PUBLICATIONS

S. Wolf and R.N. Tauber, Silicon Processing for the VLSI Era, vol. 1, p. 757, Lattice Press, 2000.*

* cited by examiner

*Primary Examiner* — Lan Vinh
*Assistant Examiner* — Jiong-Ping Lu
(74) *Attorney, Agent, or Firm* — Onello & Mello, LLP

(57) ABSTRACT

A polishing slurry includes an abrasive, a dispersion agent, a polish accelerating agent and an adhesion inhibitor. The adhesion inhibitor includes a benzene compound combined with a carboxyl group. Methods of planarizing an insulating layer using the slurry are also provided.

7 Claims, 6 Drawing Sheets

SLURRY FOR POLISHING AND PLANARIZATION METHOD OF INSULATING LAYER USING THE SAME

CROSS-REFERENCE TO RELATED APPLICATIONS

This U.S. non-provisional patent application claims priority under 35 U.S.C. §119 of Korean Patent Application No. 10-2010-0017283, filed in the Korean Intellectual Property Office on Feb. 25, 2010, the entire contents of which are incorporated by reference herein.

BACKGROUND

The present inventive concept herein relates to a slurry for polishing and a planarization method of an insulating layer using the same.

A chemical mechanical polishing (hereinafter, referred to as CMP) process is a planarization process for flattening a surface of a wafer or a semiconductor substrate during fabrication of a semiconductor device. The CMP process may include a mechanical etching process and a chemical etching process. The chemical etching process and the mechanical etching process may be performed using a slurry provided between the wafer and a polishing pad. A type of slurry for polishing may be determined in accordance with a material layer to be polished. For example, in the CMP process of a silicon oxide layer, a silica-based slurry (hereinafter, also referred to as a silica slurry) or a ceria-based slurry (hereinafter, also referred to as a ceria slurry) may be used to flatten a surface of the oxide layer. The silica slurry includes silica particles as an abrasive, and the ceria slurry includes ceria particles as an abrasive. The silica slurry is mainly used to remove a step difference of a silicon oxide layer. When the silica is used in the CMP process, byproducts may adhere to and remain on a surface of a polishing pad even after the CMP process is finished. The byproducts generated by the silica slurry may cause scratches on the surface of a wafer or a substrate. The ceria slurry is widely used to polish a flat silicon oxide layer.

SUMMARY

Exemplary embodiments of the present inventive concept are directed to a slurry containing an adhesion inhibitor.

Other exemplary embodiments of the present inventive concept are directed to methods of planarizing an insulating layer using a slurry containing an adhesion inhibitor.

According to one aspect, the inventive concept is directed to a slurry. The slurry includes a dispersion agent, a polish accelerating agent, an adhesion inhibitor, and an abrasive. The adhesion inhibitor includes a benzene compound combined with a carboxyl group.

In one embodiment, the benzene compound may include a compound in which an alkyl group is substituted in some sites of organic acid such as acetic acid, propionic acid, butyric acid, or lactic acid containing the carboxyl group.

In one embodiment, the benzene compound may include 2-methyl-benzoic acid.

In one embodiment, the polish accelerating agent may include a quinone compound.

In one embodiment, the quinone compound may include 3-hydroxy-4-methyl-phenol anion or at least one selected from a group consisting of 3-hydroxy-4-hydroxymethyl-phenol anion, 4-methyl-benzene-1,3-diol, kojic acid, maltol propionate, and maltol isobutyrate.

In one embodiment, the quinone compound may further include at least one selected from a group consisting of 4-alkyl-benzene-1,3-diol, 3-hydroxy-4-alkyl-cyclohexa-2,5-dienone, 6-alkyl-3-oxo-cyclohexa-1,4-dienol anion, 3-hydroxy-6-alkyl-cyclohexa-2,4-dienone, 4-alkyl-3-oxo-cyclohexa-1,5-dienol anion, 3-hydroxy-4-alkyl-phenol anion, 5-hydroxy-2-alkyl-phenol anion, 3-hydroxy-4-alkyl-phenol anion, 5-hydroxy-2-hydroxyalkyl-phenol anion, 3-hydroxy-4-hydroxyalkyl-phenol anion, 3-hydroxy-4-hydroxyalkyl-cyclohexa-2,5-dienone, 6-hydroxyalkyl-3-oxo-cyclohexa-1,4-dienol anion, 3-hydroxy-6-hydroxyalkyl-cyclohexa-2,4-dienone, 4-hydroxyalkyl-3-oxo-cyclohexa-1,5-dienol anion, and 4-hydroxyalkyl-benzene-1,3-diol.

In one embodiment, the dispersion agent may include a nonionic polymer or a cationic organic compound.

In one embodiment, the dispersion agent may include at least one selected from a group consisting of ethylene oxide, ethylene glycol, glycol distearate, glycol monostearate, glycol polymerate, glycol ethers, alcohols containing alkylamine, polymerate ether, a compound containing sorbitol, nonionic surfactants, vinyl pyrrolidone, celluloses, and an ethoxylate-based compound.

In one embodiment, the dispersion agent may further include at least one selected from a group consisting of diethylene glycol hexadecyl ether, decaethylene glycol hexadecyl ether, diethylene glycol octadecyl ether, eicosaethylene glycol octadecyl ether, diethylene glycol oley ether, decaethylene glycol oleyl ether, decaethylene glycol octadecyl ether, nonylphenol polyethylene glycol ether, ethylenediamine tetrakis(ethoxylate-block-propoxylate)tetrol, ethylenediamine tetrakis(propoxylate-block-ethoxylate)tetrol, polyethylene-block-poly(ethylene glycol), polyoxyethylene isooctylphenyl ether, polyoxyethylene octylphenyl ether, polyoxyethylene tridecyl ether, polyoxyethylene sorbitan tetraoleate, polyoxyethylene sorbitol hexaoleate, polyethylene glycol sorbitan monolaurate, polyoxyethylenesorbitan monolaurate, sorbitan monopalmitate, FS-300 nonionic fluorosurfactant, FSN nonionic fluorosurfactant, FSO nonionic ethoxylated fluorosurfactant, vinyl pyrrolidone, celluloses, 2,4,7,9-tetramethyl-5-decyne-4,7-diol ethoxylate, 8-methyl-1-nonanol-propoxylate-block-ethoxylate, allyl alcohol 1,2-butoxylate-block-ethoxylate, polyoxyethylene branched nonylcyclohexyl ether, and polyoxyethylene isooctylcyclohexyl ether.

In one embodiment, the abrasive may include ceria having a grain size of 70 nm to 120 nm and water.

In one embodiment, the slurry may include the dispersion agent, the polish accelerating agent, the adhesion inhibitor, the ceria, and the water which are mixed in a ratio of 0.5 to 1:1 to 2:0.5 to 1:5:91 to 93 by weight percent (wt %).

In one embodiment, wherein the slurry may have a pH value of 3 to 6.

According to another aspect, the inventive concept is directed to a method of planarizing an insulating layer, which includes preparing a substrate with a step difference and forming the insulating layer on the substrate. The insulating layer is planarized using a slurry. The slurry includes a dispersion agent, a polish accelerating agent, an adhesion inhibitor, and an abrasive. The adhesion inhibitor includes a benzene compound combined with a carboxyl group.

In one embodiment, the benzene compound may include 2-methyl-benzoic acid.

In one embodiment, the polish accelerating agent may include 3-hydroxy-4-methyl-phenol anion or at least one selected from a group consisting of 3-hydroxy-4-hydroxymethyl-phenol anion, 4-methyl-benzene-1,3-diol, kojic acid, maltol propionate, and maltol isobutyrate.

In one embodiment, the dispersion agent may includes at least one selected from a group consisting of ethylene oxide, ethylene glycol, glycol distearate, glycol monostearate, glycol polymerate, glycol ethers, alcohols containing alkylamine, polymerate ether, a compound containing sorbitol, nonionic surfactants, vinyl pyrrolidone, celluloses, and an ethoxylate-based compound.

In one embodiment, the abrasive may include ceria having a grain size of 70 nm to 120 nm and water.

In one embodiment, the slurry may include the dispersion agent, the polish accelerating agent, the adhesion inhibitor, the ceria, and the water which are mixed in a ratio of 0.5 to 1:1 to 2:0.5 to 1:5:91 to 93 by weight percent (wt %).

In one embodiment, the preparation of the substrate may include forming a hard mask layer on the substrate, and forming a trench by removing the substrate using the hard mask layer as an etching mask.

In one embodiment, the insulating layer may be planarized until the hard mask layer is exposed.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to describe principles of the inventive concept. In the drawings.

DETAILED DESCRIPTION OF THE EMBODIMENTS

Figure 1:
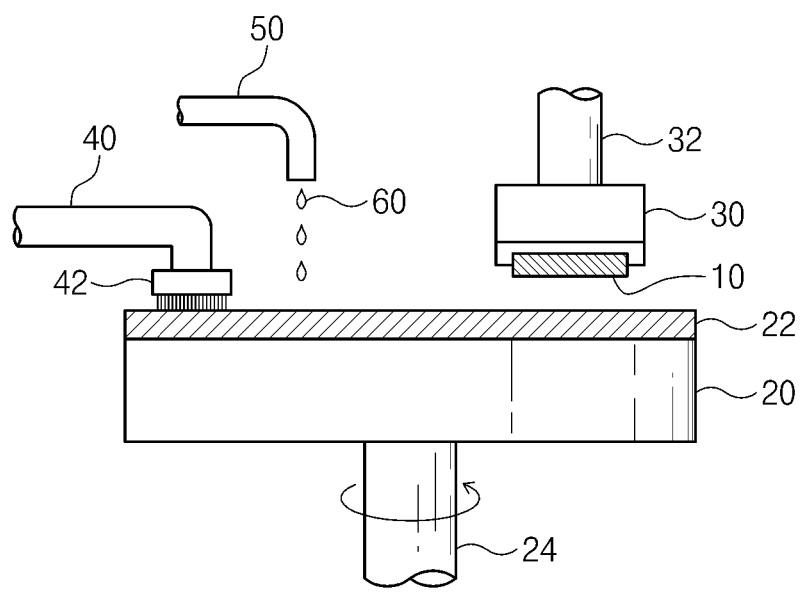
FIG. 1 is a schematic cross-sectional view to illustrate a CMP apparatus using a slurry according to an embodiment of the inventive concept.

Hereinafter, preferred embodiments of the inventive concept will be described in detail with reference to the accompanying drawings. Advantages and features of the present invention and methods of accomplishing the same may be understood more readily by reference to the following detailed description of preferred embodiments and the accompanying drawings. The exemplary embodiments of the inventive concept may, however, be embodied in many different forms and should not be construed as being limited to the embodiments set forth herein. Rather, these embodiments are provided so that this disclosure will be thorough and complete and will fully convey the scope of the inventive concept to those skilled in the art, and the embodiments of the inventive concept will only be defined by the appended claims. Like reference numerals refer to like elements throughout the specification.

The terminology used herein is for the purpose of describing various embodiments only and is not intended to be limiting of example embodiments. As used herein, the singular forms "a," "an," and "the" are intended to include the plural forms as well, unless the context clearly indicates otherwise. It will be further understood that the terms "includes", "including", "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Since preferred embodiments are described, the reference numerals used in the order of the description are not necessarily limited to its order.

A polishing slurry according to an embodiment of the inventive concept may include a slurry for removing a step difference of a silicon oxide layer. The polishing slurry may include an abrasive, a dispersion agent, a polish accelerating agent, and an adhesion inhibitor. The abrasive may include ceria ($CeO_2$) and de-ionized water. In this case, the dispersion agent, the polish accelerating agent, the adhesion inhibitor, the ceria, and the de-ionized water may be mixed in a ratio of 0.5 to 1:1 to 2:0.5 to 1:5:91 to 93 by weight percent (wt %). Here, the ceria may have an average grain size of about 70 nm to 120 nm.

If the potential of hydrogen (pH) of the slurry decreases, a polishing rate and a step-difference removing rate of the silicon oxide layer may increase. The slurry may have a pH value of about 2 to 7. In an embodiment, the slurry may have a pH value of about 3 to 6. The slurry may contain a subacid solution for pH adjustment.

The dispersion agent may ensure dispersion stability of ceria molecules. The dispersion agent may include a nonionic polymer or a cationic organic compound, For example, the dispersion agent may include at least one selected from a group consisting of ethylene oxide, ethylene glycol, glycol distearate, glycol monostearate, glycol polymerate, glycol ethers, alcohols containing alkylamine, polymerate ether, a compound containing sorbitol, nonionic surfactants, vinyl pyrrolidone, celluloses, and an ethoxylate-based compound. Specifically, the dispersion agent may include at least one selected from a group consisting of diethylene glycol hexadecyl ether, decaethylene glycol hexadecyl ether, diethylene glycol octadecyl ether, eicosaethylene glycol octadecyl ether, diethylene glycol oley ether, decaethylene glycol oleyl ether, decaethylene glycol octadecyl ether, nonylphenol polyethylene glycol ether, ethylenediamine tetrakis(ethoxylate-block-propoxylate) tetrol, ethylenediamine tetrakis(propoxylate-block-ethoxylate)tetrol, polyethylene-block-poly(ethylene glycol), polyoxyethylene isooctylphenyl ether, polyoxyethylene octylphenyl ether, polyoxyethylene tridecyl ether, polyoxyethylene sorbitan tetraoleate, polyoxyethylene sorbitol hexaoleate, polyethylene glycol sorbitan monolaurate, polyoxyethylenesorbitan monolaurate, sorbitan monopalmitate, FS-300 nonionic fluorosurfactant, FSN nonionic fluoro surfactant, FSO nonionic ethoxylated fluorosurfactant, vinyl pyrrolidone, celluloses, 2,4,7,9-tetramethyl-5-decyne-4,7-diol ethoxylate, 8-methyl-1-nonanol-propoxylate-block-ethoxylate, allyl alcohol 1,2-butoxylate-block-ethoxylate, polyoxyethylene branched nonylcyclohexyl ether, and polyoxyethylene isooctylcyclohexyl ether. As mentioned above, the content of the dispersion agent in the slurry may be within a range from about 0.5 wt % to about 1 wt %.

The polish accelerating agent may include an aromatic-based amphipathic compound. In an embodiment, the polish accelerating agent may include 3-hydroxy-4-methyl-phenol anion or a quinone compound such as 3-hydroxy-4-hydroxymethyl-phenol anion, 4-methyl-benzene-1,3-diol, kojic acid, maltol propionate, or maltol isobutyrate. The quinone compound may include at least one selected from a group consisting of dienone, diol and dienol anion. In an embodiment, each of dienone, diol and dienol anion may include alkylbenzene diols, hydroxyl group and alkyl group. In another embodiment, each of dienone, diol and dienol anion may include phenol anion and alkyl group which are connected by OXO. In still another embodiment, each of dienone, diol and dienol anion may include hydroxylalkyl and a benzene ring.

Specifically, the quinone compound may further contain at least one selected from a group consisting of 4-alkyl-benzene-1,3-diol, 3-hydroxy-4-alkyl-cyclohexa-2,5-dienone, 6-alkyl-3-oxo-cyclohexa-1,4-dienol anion, 3-hydroxy-6-alkyl-cyclohexa-2,4-dienone, 4-alkyl-3-oxo-cyclohexa-1,5-dienol anion, 3-hydroxy-4-alkyl-phenol anion, 5-hydroxy-2-alkyl-phenol anion, 3-hydroxy-4-alkyl-phenol anion, 5-hydroxy-2-hydroxyalkyl-phenol anion, 3-hydroxy-4-hydroxyalkyl-phenol anion, 3-hydroxy-4-hydroxyalkyl-cyclohexa-2,5-dienone, 6-hydroxyalkyl-3-oxo-cyclohexa-1,4-dienol anion, 3-hydroxy-6-hydroxyalkyl-cyclohexa-2,4-dienone, 4-hydroxyalkyl-3-oxo-cyclohexa-1,5-dienol anion, and 4-hydroxyalkyl-benzene-1,3-diol. As described above, the content of the polish accelerating agent in the slurry may be within a range from about 1 wt % to about 2 wt %.

The adhesion inhibitor can prevent the abrasive in the slurry from being adsorbed onto a polishing pad and a diamond disk. The diamond disk is one of the components of a pad conditioner, and the polishing pad and the pad conditioner constitute a chemical mechanical polishing apparatus. The adhesion inhibitor may contain aromatic-based anion chemical compound which is the same kind as that of the polish accelerating agent. Accordingly, the adhesion inhibitor may not react on the polish accelerating agent. The adhesion inhibitor may contain a benzene compound which does not react on the quinone compound of the polish accelerating agent. For example, the adhesion inhibitor may contain a benzene compound in which an alkyl group is substituted in some sites of organic acid such as acetic acid, propionic acid, butyric acid, or lactic acid containing a carboxyl group and combined with a carboxyl group. The benzene compound may contain 2-methyl-benzoic acid. As described above, the content of the adhesion inhibitor in the slurry may be within a range from about 0.5 wt % to about 1 wt %.

The CMP processes using the slurries according to embodiments of the inventive concept will be described with reference to FIG. 1 and FIGS. 2A through 2D. FIG. 1 is a cross-sectional view schematically illustrating a CMP apparatus, and FIGS. 2A through 2D are cross-sectional views illustrating a planarization method of a device isolating layer.

Referring to FIG. 1, the CMP apparatus may include a polishing pad 22 formed on a platen 20. The platen 20 may be rotated by a first rotation shaft 24. A polishing head 30 is disposed over the polishing pad 22. The polishing head 30 may also be rotated by a second rotation shaft 32. The polishing head 30 may hold and fix a substrate 10 so that the substrate 10 is located between the polishing pad 22 and the polishing head 30. The first rotation shaft 24 and the second rotation shaft 32 may rotate the platen 20 and the polishing head 30 in a same direction or an opposite direction by receiving a rotational force from a motor (not illustrated). The surface of the polishing pad 22 may maintain a certain roughness and cleanness using a pad conditioner 40. The pad conditioner 40 may include a diamond disk 42 which rotates to sweep and remove contaminants such as slurry residue adsorbed on the polishing pad 22. If the diamond disk 42 rotates on the polishing pad 22 to remove the contaminants adsorbed on the polishing pad 22, the thickness of the polishing pad 22 may be reduced. That is, if the diamond disk 42 removes out the contaminants on the polishing pad 22, a surface of the polishing pad 22 may have a specific roughness and cleanness. Thus, a polishing efficiency of the CMP apparatus may be recovered. A slurry supplying nozzle 50 is disposed over the polishing pad 22. A slurry 60 according to an embodiment of the inventive concept may be supplied onto the polishing pad 22 through the slurry supplying nozzle 50.

Figure 2A:
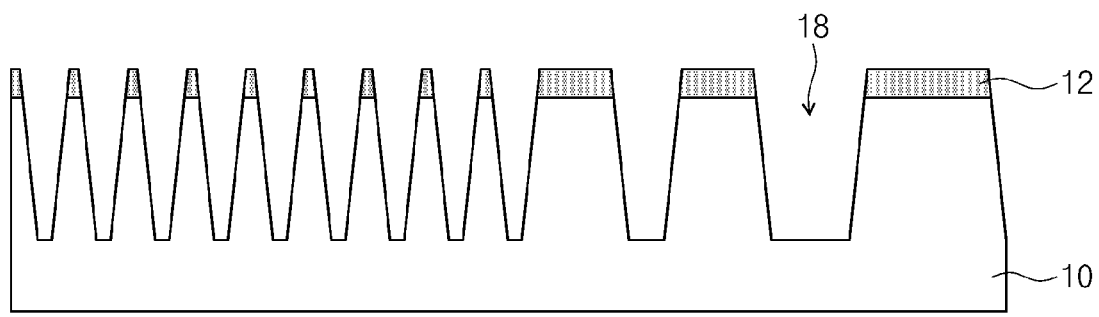
FIGS. 2A through 2D are cross-sectional views to illustrate a planarization method of a device isolating layer using a slurry according to an embodiment of the inventive concept.

Referring to FIG. 2A, a trench 18 is formed in the substrate 10. The trench 18 may be formed by etching the substrate 10 using a hard mask layer 12 as an etching mask. The hard mask layer 12 may include a silicon nitride layer. The hard mask layer 12 may be patterned by photolithography.

Figure 2B:
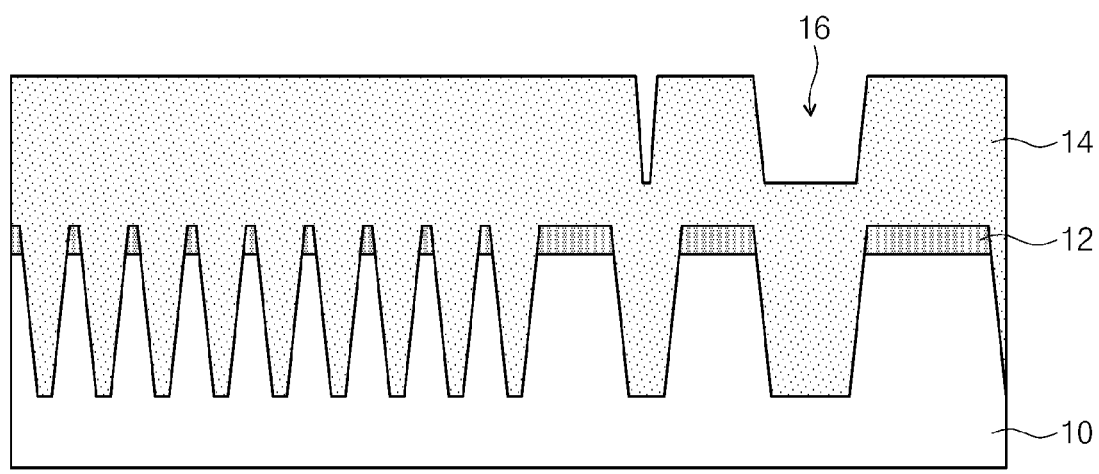

Referring to FIG. 2B, a device isolating layer 14 is formed to cover a top surface of the hard mask layer 12 and to fill the inside portion of the trench 18. The device isolating layer 14 may include a silicon oxide layer formed by a chemical vapor deposition process. The device isolating layer 14 may have an uneven top surface due to the trench 18. That is, the uneven top surface of the device isolating layer 14 may provide a recessed region 16 which is due to step differences. For example, the device isolating layer 14 may provide more step differences 16 in a peripheral region than in a cell region on the substrate 10.

Figure 2C:
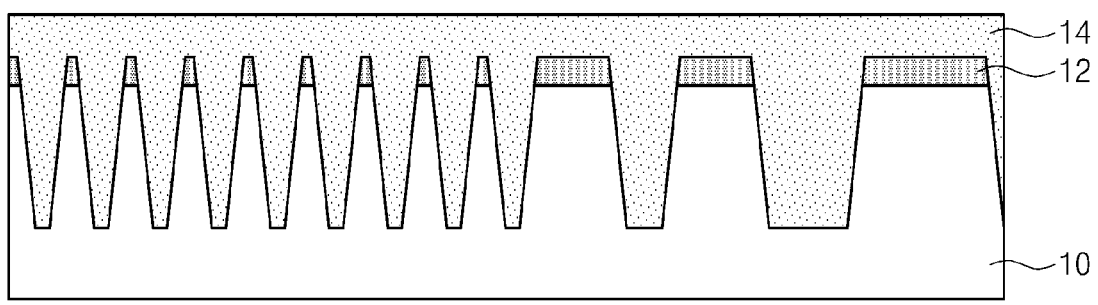

Referring to FIGS. 1 and 2C, the device isolating layer 14 with the step differences 16 may be planarized using the slurry 60 according to any one of the embodiments of the inventive concept. Here, the slurry 60 may include a ceria slurry for removing the step differences 16. The ceria slurry may be more effective than a silica slurry in terms of reducing the number of scratches. The ceria slurry may include an abrasive, a dispersion agent, and water. The ceria slurry may further include a polish accelerating agent to planarize the device isolating layer 14 with the step differences 16. Moreover, the ceria slurry may further include an adhesion inhibitor to prevent contamination of the polishing pad 22 and the diamond disk 42 during the planarization process of the device isolating layer 14.

Figure 2D:
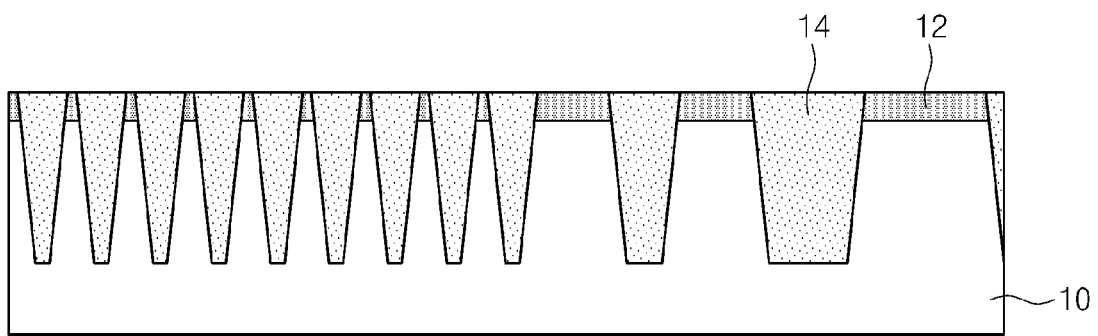

Referring to FIG. 2D, the device isolating layer 14 is continuously planarized by the ceria slurry to expose the hard mask layer 12. The ceria slurry may have a high etching selectivity with respect to the hard mask layer 12 formed of a silicon nitride layer when the device isolating layer 14 is planarized. The ceria slurry (for example, a first ceria slurry) used to expose the hard mask layer 12 may be the same as the ceria slurry (for example, a second ceria slurry) used to remove the step differences 16 illustrated in FIG. 2C. In this case, the ceria slurry may include the abrasive, the dispersion agent, the adhesion inhibitor and water. In another embodiment, however, the first ceria slurry may be different from the second ceria slurry. In this case, the second ceria slurry may include the adhesion inhibitor, whereas the first ceria slurry may not include the adhesion inhibitor.

Detailed description of the embodiments of the inventive concept continues in the following specific examples.

In order to obtain some polishing characteristics of the slurries 60 according to the embodiments of the inventive concept, some CMP processes were performed using the slurries 60 which are different from each other.

(Polishing Conditions)

In order to examine the polishing characteristics of the silicon oxide layer, a High Density Plasma (HDP) oxide layer and an Undoped Silicate Glass (USG) layer were sequentially formed to a thickness of about 7600 Å as the device isolating layer 14 on the substrate 10 in which the trench 18 was formed.

A two-layered type of pad (IC1010/Suba400 made by Rodel-Nitta Corporation) was used as the polishing pad 22. A polishing apparatus (MIRRA and LK made by AMK Corporation) was used as the CMP apparatus. The rotational speed of the platen 20 was set to about 86 rpm, and the rotational speed of the polishing head 30 was set to about 85 rpm. The processing pressure of the polishing head 30 was set to about 3 psi. The polishing period was set to about 1 minute. Each of the slurries 60 was supplied in amount of about 200 ml/min.

Example 1

The above-described slurries 60 included an abrasive, a dispersion agent, and water commonly. Some of the slurries 60 included an adhesion inhibitor. The abrasive included ceria and the dispersion agent included ethylene glycol. A step-difference removing ratio of the silicon oxide layer was measured against every sample. All the samples are different from each other in combination of the polish accelerating agent and the adhesion inhibitor. It was found that contamination occurred in the polishing pad 22 and the diamond disk 42. Moreover, it was found that the polishing pad 22 and the diamond disk 42 were prevented from being contaminated or improved by adding the adhesion inhibitor to the slurry 60. The above experimental results can be summarized as described in the following Table 1.

TABLE 1

| Sample No. | polish accelerating agent | adhesion inhibitor (benzene compound) | Step-difference removing ratio of silicon oxide layer (Å/min) | Improvement from contamination of polishing pad | Improvement from contamination of diamond disk |
|---|---|---|---|---|---|
| 1 | pyridine carboxyl acid | NO | 2500 | NO | NO |
| 2 | 3-hydroxy-4-methyl-phenol anion | NO | 2600 | NO | NO |
| 3 | 3-hydroxy-4-hydroxy-methyl-phenol anion | NO | 2600 | NO | NO |
| 4 | Pyridine carboxyl acid | YES | 2000 | (partially) YES | (partially) YES |
| 5 | 3-hydroxy-4-methyl-phenol anion | YES | 2400 | YES | YES |
| 6 | 3-hydroxy-4-hydroxy-methyl-phenol anion | YES | 2700 | YES | YES |
| reference | Cabot (D6720) | | 2500 | | |

Referring to Table 1 and FIGS. 2A through 2D, it can be seen that the slurry for polishing, to which the polish accelerating agent is added, may subject the silicon oxide layer with the step differences 16 to planarization at the step-difference removing ratio of about 2000 Å/min or more. In Sample 1 and simple 4, a known pyridine carboxyl acid of amphipathic surfactant was used as the polish accelerating agent. In Sample 2 and Sample 5,3-hydroxy-4-methyl-phenol anion was used as the polish accelerating agent. In Sample 3 and Sample 6,3-hydroxy-4-hydroxymethyl-phenol anion was used as the polish accelerating agent. The 3-hydroxy-4-methyl-phenol anion and 3-hydroxy-4-hydroxymethyl-phenol anion exhibited a more excellent step-difference removing ratio of the silicon oxide layer as compared to the pyridine carboxyl acid.

When the Samples 1 to 3 are compared to the Samples 4 to 6, it can be known that the diamond disk 42 and the polishing pad 22 are improved from the contamination as the adhesion inhibitor is added to the ceria slurry. As described above, the adhesion inhibitor may include the benzene compound combined with a carboxyl group. When the benzene compound is added to the ceria slurry together with the polish accelerating agent such as 3-hydroxy-4-methyl-phenol anion and 3-hydroxy-4-hydroxymethyl-phenol anion, as in Sample 5 and Sample 6, it is possible to improve the polishing pad 22 and the diamond disk 42 from contamination. On the other hand, since the benzene compound reacts to the polish accelerating agent of pyridine carboxyl acid, as in Sample 4, the benzene compound may partially cause contamination of the polishing pad 22 and the diamond disk 42. From the above results, it can be known that it is possible to improve the step-difference and reduce the contamination of the polishing pad 22/the diamond disk 42 by using the ceria slurry to which the adhesion inhibitor of the benzene compound containing carboxyl acid and the polish accelerating agent are added.

Example 2

The physical-chemical characteristics of Sample 3 and Sample 6 of the slurry used in Example 1 were analyzed. The characteristics were compared to those of a general ceria slurry. As the reference, there was used HS8005A10M made by Hitachi Corporation, which has a similar grain size with the slurry of Sample 3 and Sample 6.

TABLE 2

| | Sample 3 | Sample 6 | HS8005A10M |
|---|---|---|---|
| average grain size (nm) | 120 | 100 | 100 |
| Zeta potential (mV) | +12 | +35 | −45 |
| pH | 3.5 | 3.5 | 8.6 |
| step-difference removing ratio (Å/min) | 2600 | 2700 | 120 |

Referring to Table 2, since the polish accelerating agent was not added to HS8005A10M made by Hitachi Corporation, HS8005A10M made by Hitachi Corporation has a negative Zeta potential. In Sample 3 and Sample 6, there was used the ceria slurry containing the polish accelerating agent of 3-hydroxy-4-methyl-phenol anion. Since 3-hydroxy-4-methyl-phenol anion has an opposite potential to the silicon oxide layer, 3-hydroxy-4-methyl-phenol anion may combine with the silicon oxide layer by a strong attraction force. Sample 3 and Sample 6 may have a positive Zeta potential. Sample 3 and Sample 6 have acidity of about pH 3.5, but HS8005A10M made by Hitachi Corporation has basicity of about pH 8.6. Sample 3 and Sample 6 have considerably excellent step-difference removing ratio than HS8005A10M made by Hitachi Corporation.

Sample 6 may contain the ceria slurry to which the adhesion inhibitor of the benzene compound is added. Even though the average grain size of the ceria abrasive of Sample 6 is smaller than that of Sample 3, the step-difference removing ratio is larger in Sample 6. This is because the step-difference removing ratio may increase with an increase in the Zeta potential of Sample 6 containing the adhesion inhibitor. Since the Zeta potential of Sample 6 increases, it is possible to decrease the attraction force between the particles of the ceria abrasive. Moreover, it is possible to reduce the contamination of the polishing pad 22 and the diamond disk 42. The anion adhesion inhibitor adsorbs the particles of the ceria abrasive with a positive charge, thereby ensuring electrosteric stability of the ceria slurry. Accordingly, the adhesion inhibitor can prevent adsorption contamination of polishing particles on the surface of the polishing pad 22 and the diamond disk 42.

Example 3

Pad cut ratios of the diamond disks 42 with cumulative CMP time were compared to each other between the slurries produced in the above-described methods. The term "pad cut ratio" means a difference between a first thickness of the polishing pad 22 before an operation of the diamond disk 42 and a second thickness of the polishing pad 22 after the operation of the diamond disk 42. That is, if the pad cut ratio is high, the polishing pad 22 may have a clean and rough surface after the operation of the diamond disk 42 of the pad conditioner 40. Thus, if the pad cut ratio is high, the polishing pad 22 may exhibit a high polishing efficiency.

Figure 3:
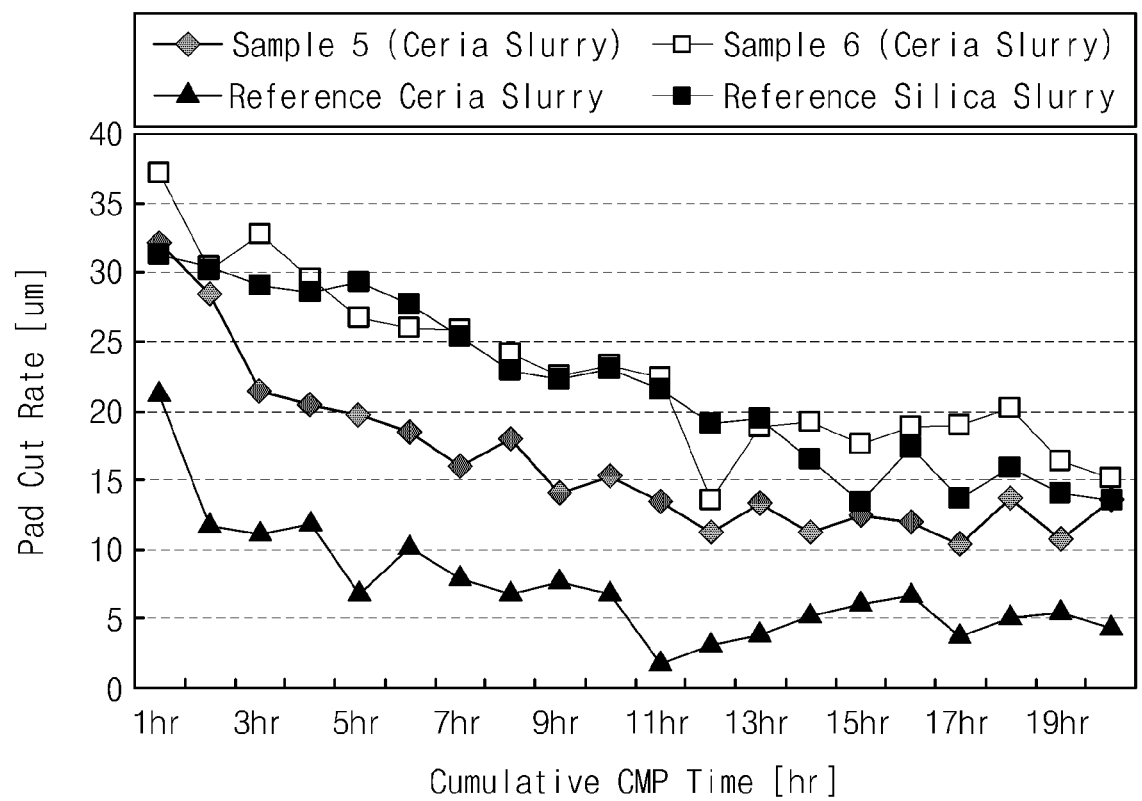
FIG. 3 is a graph showing comparison of the pad cut ratios of the diamond disks with the cumulative CMP time between slurries according to embodiments of the inventive concept and the known slurries.

FIG. 3 is a graph showing comparison of the pad cut ratios of the diamond disks with the cumulative CMP time between the slurry according to the embodiments of the inventive concept and the known slurries. In FIG. 3, the horizontal axis represents the cumulative time and the vertical axis represents the pad cut ratio.

Referring to FIG. 3, the ceria slurry of Sample 6 exhibited a pad cut ratio similar to that of the reference silica slurry with the cumulative CMP time.

The CMP processes were performed during the cumulative CMP time of about 20 hours and the test was carried out at every hour. D6720 of Cabot was used as the reference ceria slurry and STARPLANAR 3000 made by Cheil Industries was used as the reference silica slurry. The polish accelerating agent and the adhesion inhibitor were added to the ceria slurries of Sample 5 and Sample 6.

The test result shows that the reference ceria slurry has a considerably lower pad cut ratio than the ceria slurries of Sample 5 and Sample 6. The reference ceria slurry is not appropriate for removing the step-difference 16, since the pad cut ratio is very low after the Cumulative CMP time of about 10 hours.

On the contrary, the ceria slurry of Sample 6 has a pad cut ratio of the diamond disk 42 similar to that of the reference silica slurry. The ceria slurry of Sample 6 may have a high pad cut ratio, since the hydrophilic property of a hydroxyl group (OH) is enhanced.

Example 4

The ceria slurry produced according to the embodiment of the inventive concept was applied to the CMP process of the device isolating layer. The device isolating layer was formed to a thickness of about 7600 Å on the substrate 10. The silica slurry was used for comparison to the ceria slurry. The test was carried out in the process of removing the step difference 16. The thicknesses of the remaining silicon oxide layer (Remain Tox) were compared to each other after the polishing of 30 seconds, and scratches were analyzed after the CMP process of the device isolating layer.

Figure 4:
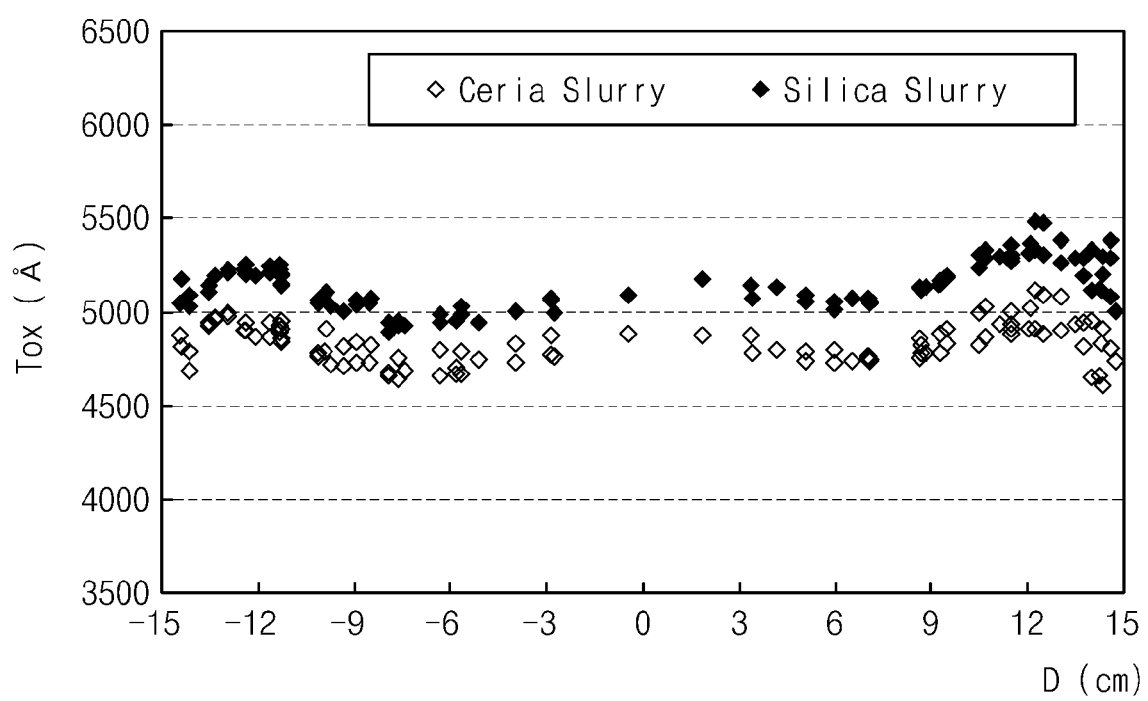
FIG. 4 is a graph showing the thickness of the device isolating layer remaining after CMP processes using slurries according to embodiments of the inventive concept and using known slurries.
Figure 5:
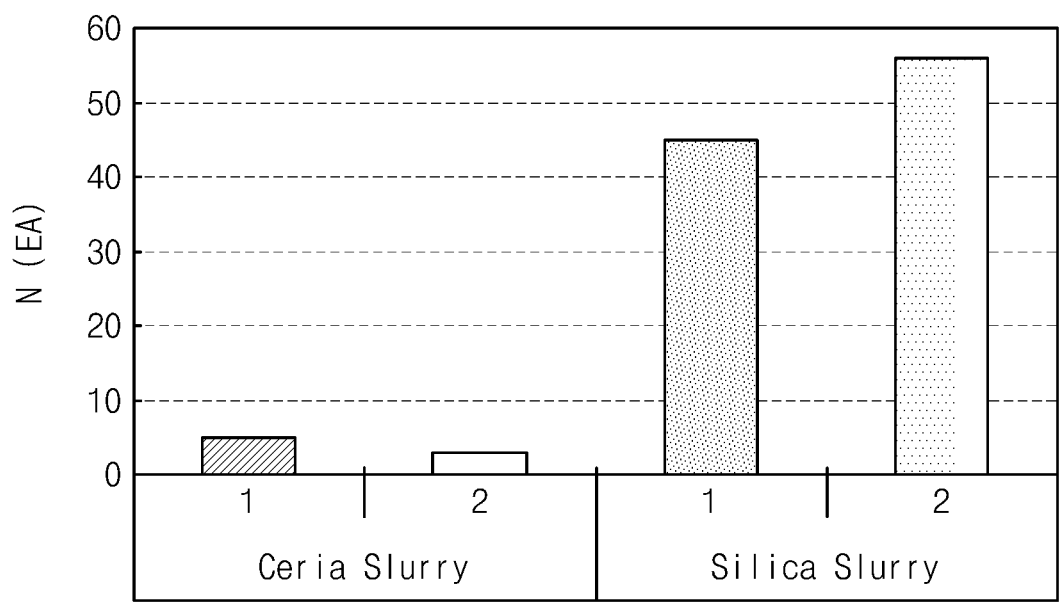
FIG. 5 is a diagram showing the number of scratches generated during the CMP processes of FIG. 4.

The test result shows that the step-difference removing ratio was higher in the ceria slurry produced according to the embodiment of the inventive concept than in the silica slurry for the same 30 seconds. The scratch result tested after the final CMP process of the device isolating layer shows that the ceria slurry was excellent (20% in comparison to the silica slurry). FIGS. 4 and 5 show the results.

FIG. 4 is a graph showing the thickness of the device isolating layer remaining after the CMP process of the device isolating layer of a DRAM. Referring to FIG. 4, the ceria slurry produced according to the embodiment of the inventive concept can remove the silicon oxide layer thicker than that of the silica slurry in the CMP process. Here, the horizontal axis of the graph represents a distance (D) from a central point of the substrate 10 having a diameter of 30 cm. The vertical axis of the graph represents a remaining thickness (Tox) of the device isolating layer after the CMP process is performed for 30 seconds.

FIG. 5 is a diagram illustrating the number of scratches generated during the CMP process of FIG. 4. Referring to FIG. 5, the ceria slurry may have about five or less scratch defects in average on two substrates 10 in the CMP process. However, the silica slurry may have about fifty scratch defects in average on two substrates 10 in the CMP process. Here, the horizontal axis represents two substrates 10 subjected to the CMP process of using the ceria slurry and the silica slurry. The vertical axis represents the number (N) of scratch defects on the substrate 10.

The ceria slurries produced according to the embodiments of the inventive concept can considerably reduce the scratch defects in comparison to the silica slurry. Therefore, the ceria slurries according to the embodiments of the inventive concept can substitute the conventional silica slurry with the scratch defect problem in the CMP process of removing the step difference of the silicon oxide layer.

As described above, according to the embodiment of the inventive concept, it is possible to remove the step difference of the silicon oxide layer by adding the polish accelerating agent to the polishing slurry containing the ceria abrasive.

The polishing slurry containing the ceria abrasive can minimize the scratch defects upon removing the step difference of the silicon oxide layer.

By adding the adhesion inhibitor to the polishing slurry, it is possible to reduce the contamination of the diamond disk of the conditioner and the polishing pad. Moreover, by increasing the use time of the polishing pad and the diamond disk, it is possible to increase productivity.

Although the present invention has been described in connection with the embodiment of the present invention illustrated in the accompanying drawings, it is not limited thereto. It will be apparent to those skilled in the art that various substitution, modifications and changes may be thereto without departing from the scope and spirit of the invention. Therefore, the above-described embodiments are to be considered illustrative and not restrictive.

What is claimed is:

1. A planarization method of an insulating layer comprising:
preparing a substrate with a step difference;
forming the insulating layer on the substrate; and
planarizing the insulating layer using a ceria slurry,
wherein the slurry includes an abrasive, a dispersion agent, a polish accelerating agent, and an adhesion inhibitor,
the polish accelerating agent includes 3-hydroxy-4-methyl-phenol anion or at least one selected from a group consisting of 3-hydroxy-4-hydroxymethyl-phenol anion, 4-methyl-benzene-1,3-diol, maltol propionate, and maltol iosbutyrate; and the adhesion inhibitor includes a benzene compound combined with a carboxyl group.

2. The planarization method of claim 1, wherein the benzene compound includes 2-methyl-benzoic acid.

3. The planarization method of claim 1, wherein the dispersion agent includes at least one selected from a group consisting of ethylene oxide, ethylene glycol, glycol distearate, glycol monostearate, glycol polymerate, glycol ethers, alcohols containing alkylamine, polymerate ether, a compound containing sorbitol, nonionic surfactants, vinyl pyrrolidone, celluloses, and an ethoxylate-based compound.

4. The planarization method of claim 1, wherein the abrasive includes ceria having a grain size of 70 nm to 120 nm and water.

5. The planarization method of claim 4, wherein the dispersion agent, the polish accelerating agent, the adhesion inhibitor, the ceria, and the water are mixed in a ratio of 0.5 to 1:1 to 2:0.5 to 1:5:91 to 93 by weight percent (wt %).

6. The planarization method of claim 1, wherein preparing of the substrate includes:
   forming a hard mask layer on the substrate; and
   forming a trench by removing the substrate using the hard mask layer as an etching mask.

7. The planarization method of claim 6, wherein the insulating layer is planarized until the hard mask layer is exposed.

* * * * *